United States Patent [19]
Shirasaki et al.

[11] Patent Number: 5,834,894
[45] Date of Patent: Nov. 10, 1998

[54] CARRIER INJECTION TYPE ORGANIC ELECTRO-LUMINESCENT DEVICE WHICH EMITS LIGHT IN RESPONSE TO AN APPLICATION OF A VOLTAGE

[75] Inventors: Tomoyuki Shirasaki, Hachioji; Norihiko Kaneko, Ome; Hiroyasu Yamada, Hachioji, all of Japan

[73] Assignee: Casio Computer Co., Ltd., Tokyo, Japan

[21] Appl. No.: 711,869

[22] Filed: Sep. 12, 1996

[30] Foreign Application Priority Data

Sep. 14, 1995 [JP] Japan .................................. 7-260997
May 23, 1996 [JP] Japan .................................. 8-150473

[51] Int. Cl.⁶ .................................................... H01J 1/62
[52] U.S. Cl. .................... 313/509; 313/503; 313/506; 313/507; 313/504
[58] Field of Search .................... 313/509, 504, 313/506, 505, 500

[56] References Cited

U.S. PATENT DOCUMENTS 4,356,429  10/1982  Tang .
5,281,489  1/1994  Mori et al. ............................ 313/506
5,304,895  4/1994  Ujihara ................................. 313/505
5,554,450  9/1996  Shi et al. .............................. 313/506
5,652,067  7/1997  Ito et al. ............................... 313/500

*Primary Examiner*—Sandra L. O'Shea
*Assistant Examiner*—Joseph Wiliams
*Attorney, Agent, or Firm*—Frishauf, Holtz, Goodman, Langer & Chick

[57] ABSTRACT

A carrier-injection type organic electroluminescent device includes, provided on a substrate, a transparent anode electrode, and a hole transport layer containing hole-transporting poly(N-vinylcarbazole) and 2,5-bis(1-naphthyl)-oxadiazole, and 3-(2'-benzothiazoyl)-7-diethylaminocoumarin as a fluorescent material which absorbs light within a predetermined wavelength range and emits light having a longer wavelength. Further included are an electron transport layer containing an electron-transporting tris(8-quinolinolate)aluminum complex, and a cathode electrode. When a voltage is applied between the anode and the cathode, the fluorescent material absorbs light emitted by the recombination of electrons and holes, and emits visible light.

19 Claims, 20 Drawing Sheets

CARRIER INJECTION TYPE ORGANIC ELECTRO-LUMINESCENT DEVICE WHICH EMITS LIGHT IN RESPONSE TO AN APPLICATION OF A VOLTAGE

BACKGROUND OF THE INVENTION

1. Field of the Invention

The present invention relates to an electro-luminescent device, and more particularly, to a carrier-injection type organic electro-luminescent device.

2. Description of the Related Art

An organic electro-luminescent device (hereinafter referred to as an "organic EL device") includes a so-called Molecularly Doped Polymer (MDP) type EL device comprising a polymer wherein a fluorescent material emitting light is dispersed in a carrier transport layer where carriers, i.e. electrons and holes as particles having electric charges whose polarities are different from each other are recombined by injection. The MDP type EL device can be distinguished from a device having a luminescent layer of a low-molecular organic material. The MDP type EL device utilizes a technique whereby the carrier transport layer emits light within a predetermined wavelength range due to excitons formed by the recombination and the fluorescent material absorbs this light and emits light within a longer wavelength range.

The MDP type luminescent device has advantages in that the production process and selection of a luminescent color are comparatively easy in comparison with the low-molecular luminescent device and, therefore, it has been developed as a multi-color display device. However, the MDP type EL device has problems in that the injection properties and mobility of the carrier are inferior due to physical properties of the carrier transparent layer, and a leakage current is large. Therefore, the luminous efficiency is low. The organic EL device has a construction that the carrier transport layer is interposed between the anode electrode and cathode electrode. A conductive material having a high work function value is applied as the anode electrode for hole injection properties and a conductive material having a work function value lower than that of the anode electrode is applied as the cathode electrode for electron injection properties. However, the material having a low work function is liable to be oxidized and is rapidly deteriorated when exposed to air, which is one of the causes for a short luminous life of the organic EL device.

SUMMARY OF THE INVENTION

It is an object of the present invention to provide an organic EL device having an improved luminous efficiency per unit area. In order to accomplish this object, an electron transport layer containing an electron transporting material and a hole transport layer containing a first hole transporting material and a second transporting material having a highest occupied molecular orbital which is different from that of the first hole transporting material are arranged between a pair of an anode electrode and a cathode electrode. Since the carrier transport layer which participates in hole transporting and electron transporting is divided into two layers, a mobility of carriers in each layer is improved. Since the hole transport layer is a composite layer of different hole transporting materials, a high luminous efficiency can be realized by mixing a hole transporting material, which has good transporting properties and which is difficult to form a film by itself, with another hole transporting material which is easy to form a film by itself.

It is another object of the present invention to provide an organic EL device of a structure that inhibits oxidation of a conductive material having a low work function. In order to accomplish this object, the organic EL device has a construction that a conductive layer containing a second conductive material having a work function lower than that of a first electron transporting material of a cathode electrode is interposed between the cathode electrode and an electron transport layer. Such a construction affords extremely high electron injection properties into the electron transport layer. If the conductive layer contains the same material as that of the electron transport layer, it can exhibit good joining properties with the electron transport layer.

BRIEF DESCRIPTION OF THE DRAWINGS

The present invention will become more apparent from the following detailed description, when taken in conjunction with the accompanying drawings, in which.

DETAILED DESCRIPTION OF THE PREFERRED EMBODIMENTS

The following embodiments shown in the accompanying drawings further illustrate the organic EL device of the present invention in detail.

First embodiment

Figure 1:
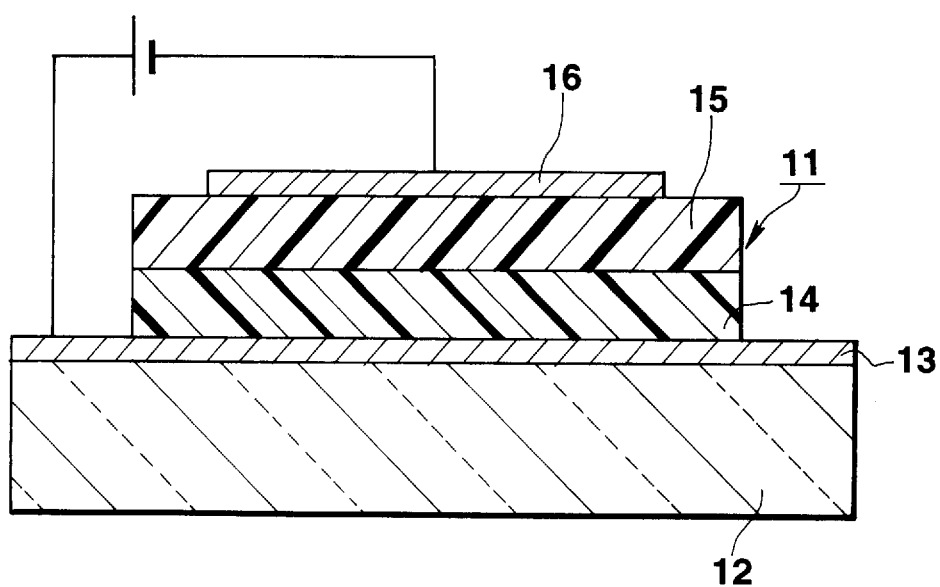
FIG. 1 is a sectional view illustrating a structure of the organic EL device according to a first embodiment of the present invention.

FIG. 1 is a sectional view illustrating a structure of an organic EL device according to a first embodiment of the present invention. FIG. 1 shows an organic EL device 11, wherein an anode electrode 13, a luminescent layer 14 which also serves as a hole transport layer, an electron transport layer 15 and a cathode electrode 16 are laminated in this order on a transparent substrate 12 of glass or a synthetic resin. The anode electrode 13 is a thin film of ITO ($In_2O_3$—$SnO_2$) or IXO ($In_2O_3$—$ZnO$), which has a transmittance of not less than 70% to visible light, and a sheet resistance of not more than 50Ω. The cathode electrode has a thickness of 50 to 150 nm. In the present invention, visible light is defined as an electromagnetic wave within the range from 400 to 800 nm. The luminescent layer 14 is made of poly(N-vinylcarbazole) (hereinafter referred to as "PVCz"), serving as a binder and a hole transporting material, to which 2,5-bis(1-naphthyl)-oxidiazole (hereinafter referred to as "BND"), and 3-(2'-benzothiazoyl)-7-diethylaminocoumarin (hereinafter referred to as "coumarin 6") as a fluorescent material are mixed. PVCz itself has hole transporting properties and serves as a dispersant for reducing density quenching of coumarin 6 due to a hydrogen bond and as a binder for binding BND, which is difficult to form a film by itself, and the fluorescent material.

The structural formulas of PVCZ, BND and coumarin 6 are shown below.

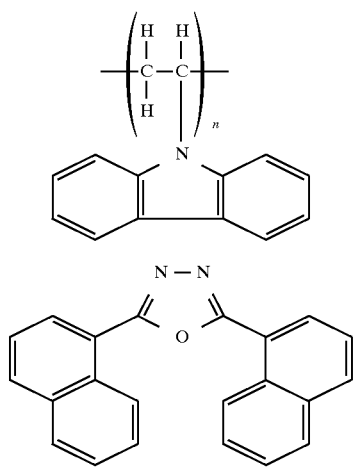

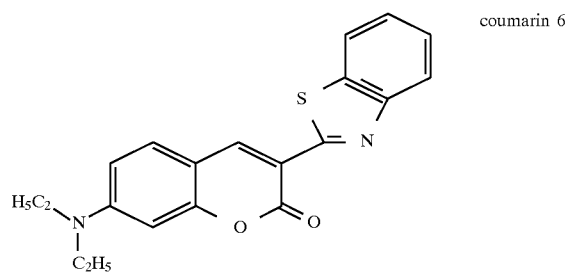

Coumarin 6 is formulated in a proportion (molar ratio) of about 3/100 relative to the one N-vinylcarbazole (VCz) unit, and emits light due to excitons formed by the recombination of electrons and holes in the luminescent layer 14. BND is formulated in a proportion (molar ratio) of about 17/100 relative to one VCz unit, and has a relative band gap which induces injection of electrons into the luminescent layer 14 as well as injection and transport of holes into the luminescent layer 14. The luminescent layer 14 is formed adjacent to the anode electrode 13 in the form of a single layer having a thickness within the range from 20 to 100 nm, more preferably from 65 to 80 nm, and thus holes are directly injected thereinto from the anode electrode 13.

The electron transport layer 15 is a single-layer film of a tris(8-quinolinolate)aluminum complex (hereinafter referred to as "Alq3") and serves to inject electrons into the luminescent layer 14. The structural formula of Alq3 is shown below.

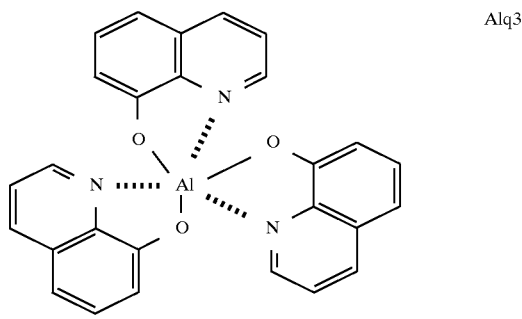

The cathode electrode 16 is composed of a material having a low work function value for injection properties of electrons and may be a thin film of a metallic material, such as magnesium (Mg), magnesium alloy (Mg—In, Mg—Ag), having a thickness of 50 to 500 nm, which is reflective to visible light. A predetermined voltage is applied between the anode electrode 13 and cathode electrode 16, and holes and electrons are respectively injected into the respective layers 14, 15, thereby emitting light in the luminescent layer 14.

Figure 2:
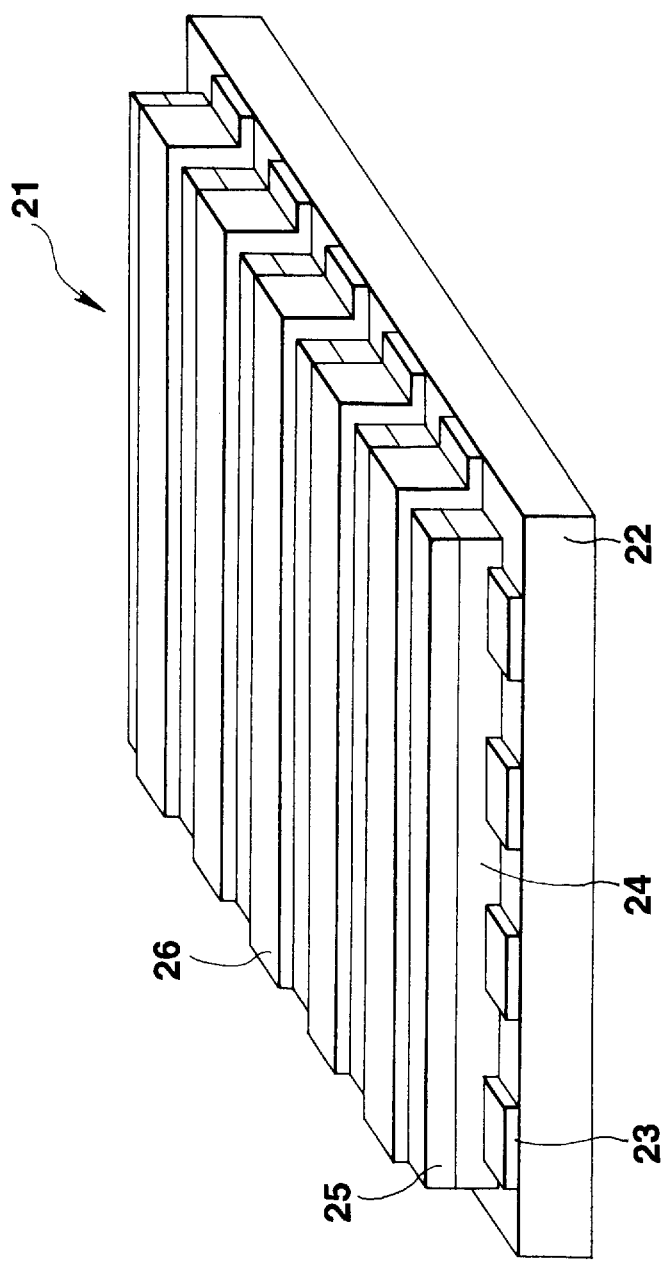
FIG. 2 is a perspective view illustrating a structure of the matrix type organic EL display device according to the first embodiment of the present invention.

FIG. 2 is a perspective view illustrating a structure of a matrix type organic EL display device 21 according to the first embodiment of the present invention. A plurality of anode electrodes 23 of ITO or IXO extending in the line direction are arranged on a transparent substrate 22, and a luminescent layer 24 of PVCz, BND and coumarin 6 and an electron transport layer 25 of Alq3 are laminated in order on the entire surface of the substrate 22. A plurality of cathode electrodes 26 of a magnesium alloy extend thereon in the row direction perpendicular to the line direction, and an intersection of the anode electrode 23 and cathode electrode 26 respectively forms a pixel.

A selective signal voltage is sequentially applied to the anode electrode 23 at every each line. A luminous signal voltage corresponding to display data synchronizes with the selective signal voltage and is simultaneously applied to the cathode electrodes 26. Regarding the selected line, coumarin 6 emits visible light within a predetermined wavelength range due to excitons formed by the recombination of electrons and holes, and each pixel maintains light emission during one flame and display is effected on the whole image plane.

In the organic EL device having such a structure, gradation of light emission can be controlled by a voltage value applied between the electrodes 23, 26. It is also possible to effect multi-color display by mixing two or more kinds of fluorescent materials emitting light within any desired wavelength range in the carrier transport layer corresponding to the respective pixels.

Figure 3:
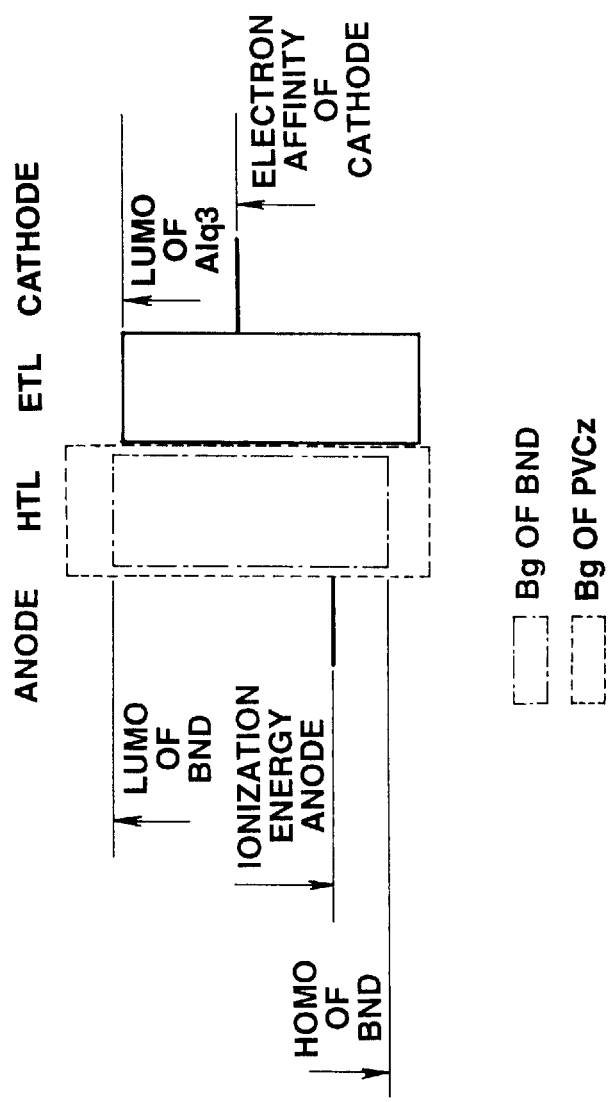
FIG. 3 is an energy diagram of the organic EL device according to the first embodiment of the present invention.

The luminous process of a two-layer structure organic EL device comprising a luminescent layer of PVCz, BND and coumarin 6 and an electron transport layer of Alq3 is shown in FIG. 3.

The mobility of electrons in the organic carrier transport layer depends on a level of a lowest unoccupied molecular orbital (LUMO) of the respective materials and the mobility of holes depends on a level of a highest occupied molecular orbital (HOMO). In other words, the movement of particles having electric charges is reflected in upper and lower levels of an intrinsic band gap of the respective materials. In the whole system including electrodes, electrons are reflected in an electron affinity (eV) of the respective materials and holes are reflected in an ionization energy (eV) of the respective materials.

Regarding injection of electrons from the cathode electrode into the electron transport layer (ETL), there is a potential barrier between the electron affinity of the cathode and a level of LUMO of Alq3, but it can be realized by applying a voltage of a predetermined value between the cathode and anode to get over the potential barrier. Regarding injection of holes from the anode electrode into the hole transport layer (HTL), there is a potential barrier between the ionization energy of the anode and a level of HOMO of the material in HTL, but it can be realized by applying a voltage between the cathode and anode to get over the potential barrier.

Figure 4:
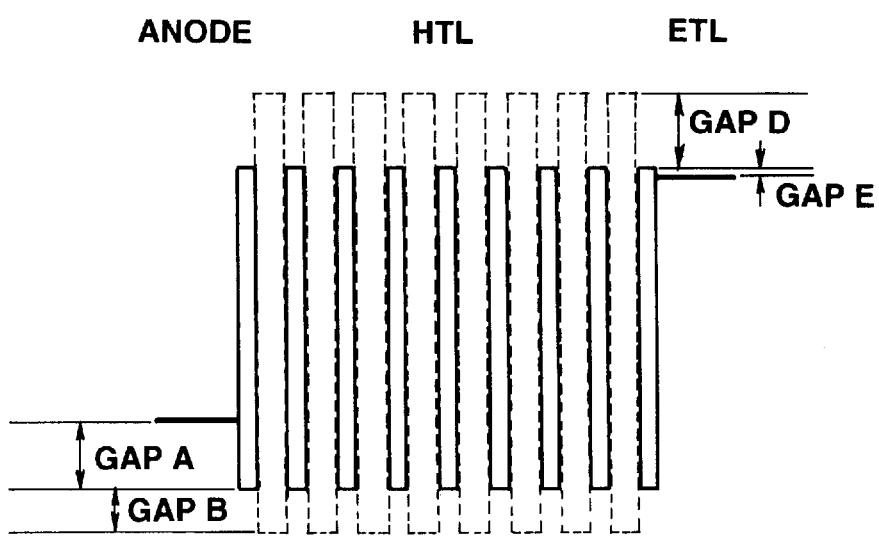
FIG. 4 is a schematic diagram illustrating carrier injection of an organic EL device of the present invention.

The movement of holes in HTL is mainly conducted by hopping conduction wherein they move on a trapping site formed by mixing PVCz with BND, as shown in FIG. 4. That is, holes, which got over a GAP A as a difference between the ionization energy of the anode and a level of HOMO of BND by applying a voltage, gets over a gap B between the level of HOMO of BND and that of HOMO of PVCz in turn toward ETL. Electrons injected into Alq3 gets over a GAP E by applying a voltage, but remains in the vicinity of the interface between HTL and ETL because a GAP D is large. Therefore, recombination of the electrons and holes transported in HTL occurs to form singlet excitons having no electric charge. The singlet exciton is deactivated after irregular movement of about 10 nm, but is captured by coumarin 6 to emit visible light within a predetermined wavelength range.

Figure 5:
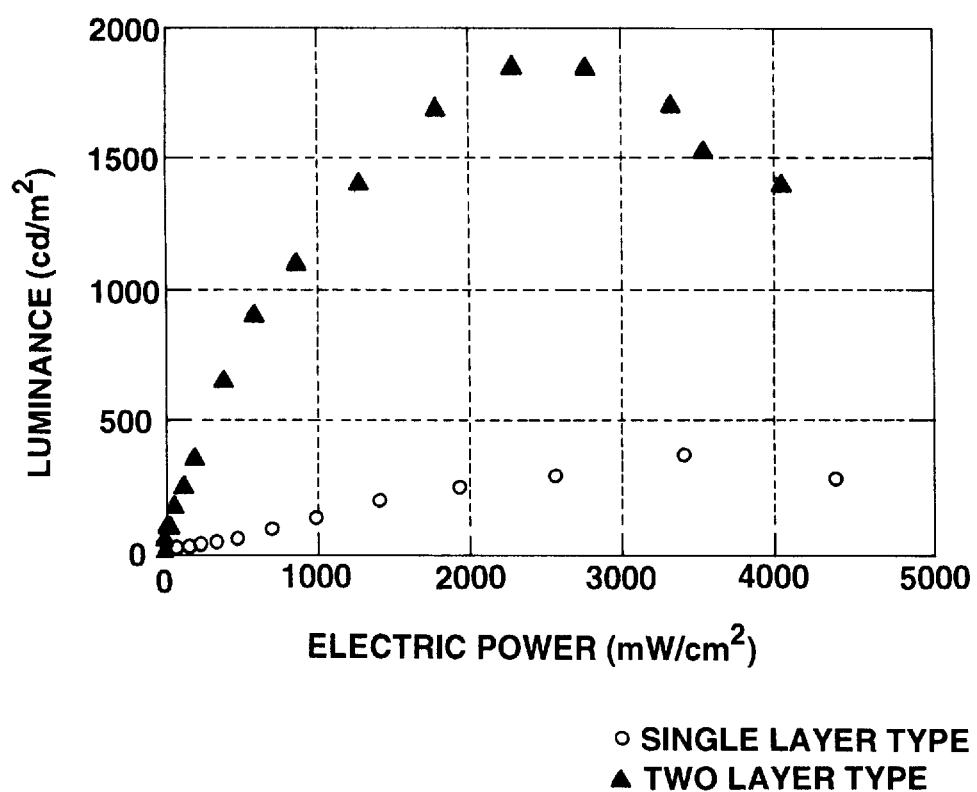
FIG. 5 is a graph illustrating a correlation between electric power consumed and luminance of an organic EL device comprising a two-layer type carrier transport layer of the present invention and an organic EL device comprising a single-layer type carrier transport layer as the Comparative Example.

FIG. 5 is a graph illustrating electric power per unit area-luminance characteristics of the organic EL device of a two-layer structure comprising a hole transport layer of PVCz, BND and coumarin 6 having a thickness of 50 nm and an electron transport layer of Alq3 having a thickness of 50 nm, and electric power per unit area-luminous characteristics of the organic EL device of a single-layer structure comprising a hole transport layer of PVCz, BND and coumarin 6 having a thickness of 100 nm as the Comparative Example. It has been confirmed that the luminous efficiency of the organic EL device of the two-layer structure is remarkably improved in comparison with the organic EL device of the single-layer structure, and the luminance which is about 6 times greater than that of the organic EL device of the single-layer structure at most can be obtained.

Figure 6:
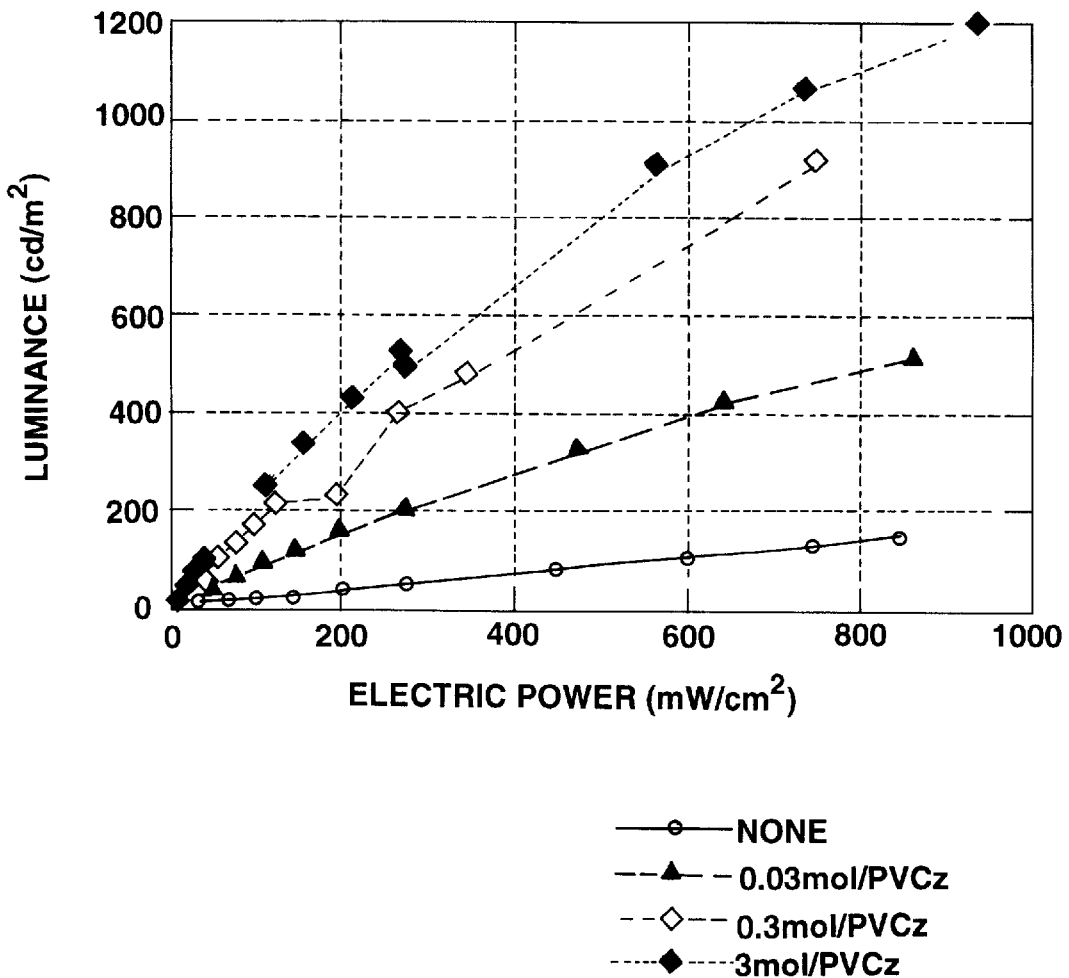
FIG. 6 is a graph illustrating a correlation between electric power consumed and luminance for concentration of a fluorescent material of an organic EL device of the present invention.

FIG. 6 is a graph illustrating molar concentration of coumarin 6 formulated in the hole transport layer relative to a VCz unit-luminous characteristics. The larger the concentration of coumarin 6, the higher the luminous efficiency became. When the concentration of coumarin 6 is from 0 to 3%, a device containing 3% coumarin 6 showed the best luminous efficiency.

Figure 7:
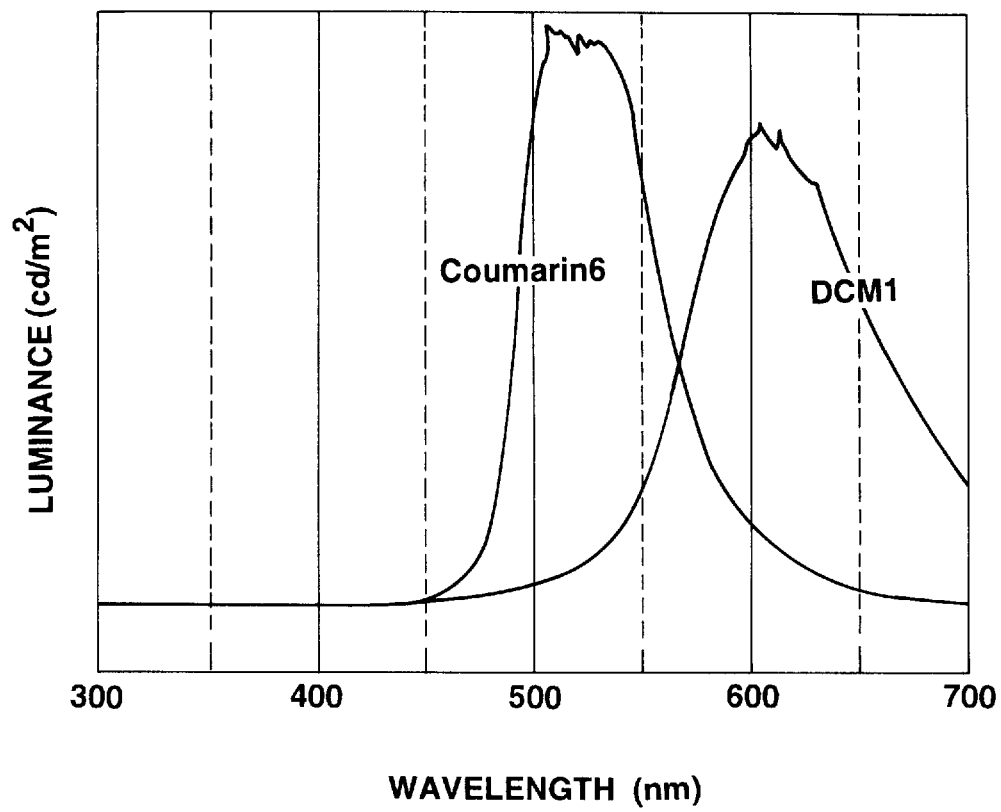
FIG. 7 is a graph illustrating an emission spectrum of a fluorescent material of the present invention.

FIG. 7 is a graph illustrating an emission spectrum of various fluorescent materials. Coumarin 6 emits green light having a peak at about 525 nm, while 4-(dicyanomethylene) -2-methyl-6-(p-dimethylaminostyryl)-4H-pyran (hereinafter referred to as "DCM1") emits light of orange to red color having an emission peak at about 600 nm. The structural formula of DCM1 is shown below.

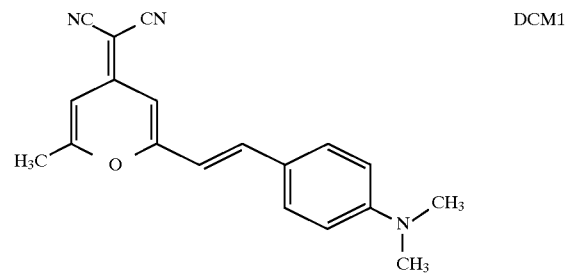

As described above, in the two-layer type organic EL device of the present invention, the luminescent layer 14 firstly emits light having a wavelength corresponding to the energy gap, i.e., ultraviolet light, via a singlet excited state, and then the fluorescent material absorbs the light to emit visible light as light having a longer wavelength. In this case, when fluorescent materials having large light absorption characteristics within the ultraviolet wavelength range and emitting lights within a predetermined wavelength range, e.g., those emitting different lights such as red, green and blue lights, are mixed within a predetermined region of the luminescent layer, a multi-layer color emission can be displayed. In the present invention, ultraviolet light is defined as an electromagnetic wave within the range from 1 to 400 nm. To the contrary, in the organic EL device comprising Alq3 as the luminescent layer, Alq3 itself emit green color and, therefore, blue light is not emitted even if a blue fluorescent material is doped into Alq3. Examples of the blue fluorescent material include 4,4'-bis(2,2'-diphenylvinylene)biphenyl, 4,4'-bis((2-carbazole)vinylene) biphenyl, tetraphenylbutadiene derivative, cyclopentadiene derivative, oxadiazole derivative, etc.

In the organic EL device of the present invention, Alq3 is used as the electron transport layer, and PVCz and BND are used as the luminescent layer and, further, a fluorescent material is used in the luminescent layer. Therefore, the luminous efficiency is extremely good and light of any desired color can be emitted.

The process for producing such an organic EL device will be explained below.

An anode electrode of an ITO film or IXO, which has a transmittance of not less than 70% to visible light and a sheet resistance of not more than 50Ω, is formed on a transparent substrate of glass or a resin by vapor deposition in a thickness of 50 nm to 150 nm. A solution prepared by dissolving PVCz, BND and a fluorescent material in a solvent is applied thereon by dip coating or spin coating so that the resultant film becomes a luminescent layer having a thickness of about 20 to 100 nm. BND and coumarin 6 are respectively mixed in the solution in a proportion (molar ratio) relative to one VCz unit of about 17/100 and about 3/100. After forming the fluorescent layer, a layer of Alq3 is formed by vapor deposition in a thickness of about 20 to 100 nm, and a Mg—Ag alloy as the cathode electrode is deposited on the Alq3 layer in a thickness of 50 to 500 nm. The organic EL device thus produced may be entirely coated with a sealing material so as to seal it against oxygen and water. When a multi-layer EL device is produced, a luminescent layer wherein a plurality of fluorescent materials corresponding to a luminescent color are mixed in the respective regions may be formed. In case of a red light emission display, a green light emission display or a blue light emission display, DCM1 (red), coumarin 6 (green) or 4,4'-bis(2,2'-diphenylvinylene)biphenyl (blue) may be added, in addition to PVCz and BND. All these materials are liable to absorb light within the ultraviolet wavelength range.

Second embodiment

In the first embodiment, the layer obtained by mixing PVCz, BND and the fluorescent material was used as HTL. In order to reduce the trapping site formed by mixing PVCz with BND with respect to the mobility of holes, N,N'-diphenyl-N,N'-bis(3-methylphenyl)-1,1'-biphenyl-4,4'-diamine may be mixed as a triphenyldiamine derivative (hereinafter referred to as "TPD"), in addition to PVCz, BND and the fluorescent material. The structural formula of this compound is shown below.

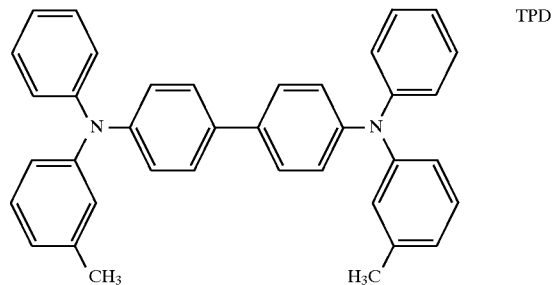

TPD

Figure 8:
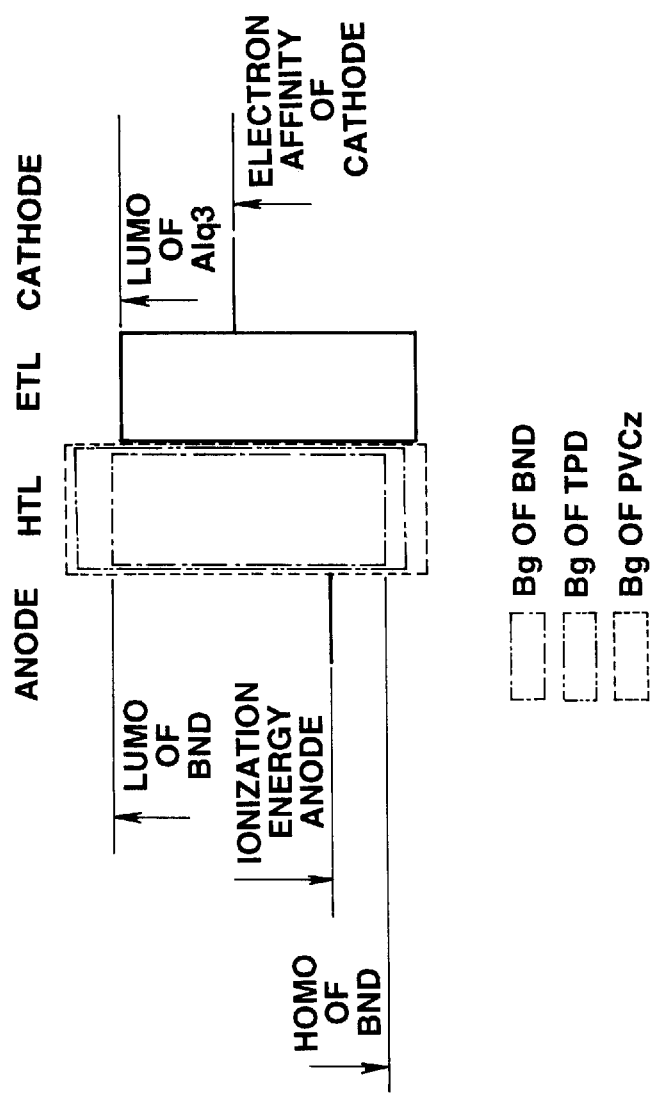
FIG. 8 is an energy diagram of an organic EL device according to a second embodiment of the present invention.

The organic EL device having such a structure affords an energy diagram as shown in FIG. 8, and TPD has a band gap so as to reduce a GAP B shown in FIG. 4. That is, a level of HOMO of TPD exists between the level of HOMO of BND and that of HOMO of PVCz and, therefore, the mobility of holes directed to the ETL side in HTL becomes good and the luminous efficiency is improved.

Third embodiment

In the third embodiment, a three-layer structure type organic EL device is shown.

Figure 9:
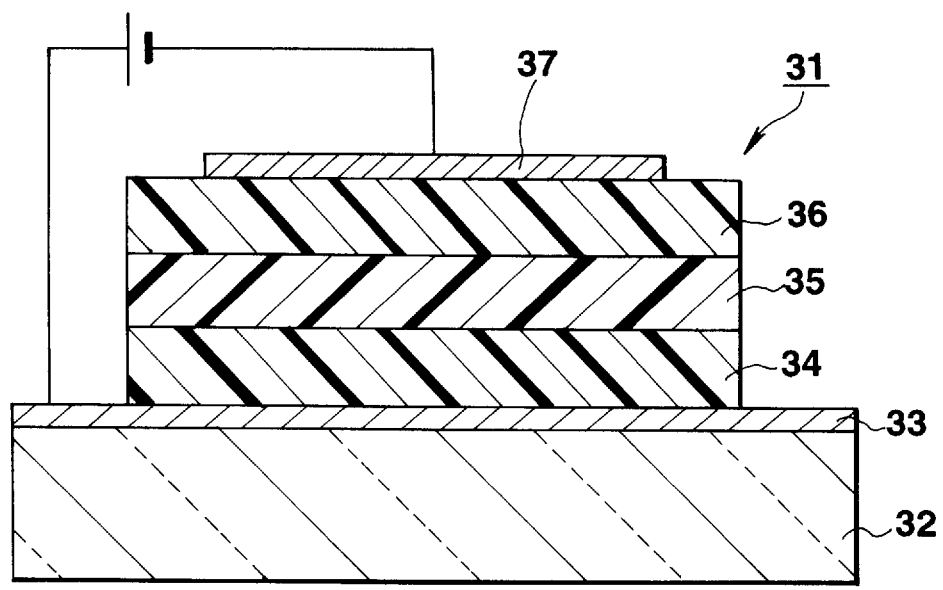
FIG. 9 is a sectional view illustrating a structure of an organic EL device according to a third embodiment of the present invention.

As shown in FIG. 9, an organic EL device 31 has an anode electrode 33 of ITO or IXO provided on a transparent substrate 32, and a hole transport layer 34, a luminescent layer 35 and an electron transport layer 36 are laminated in this order on the anode electrode 33. A cathode electrode 37 is formed on the electron transport layer 36. The hole transport layer 34 is composed of N,N'-diphenyl-N,N'-bis (3-methylphenol)-1,1'-biphenyl-4,4'-diamine as a TPD. The luminescent layer 35 is a layer consisting of PVCz, TPD, BND and coumarin 6 and holes are injected thereinto from the hole transport layer 34. The electron transport layer 36 is composed of Alq3 and has properties of injecting electrons into the luminescent layer 35. The cathode electrode 37 is composed of a material having a low work function value for injection properties of electrons, and examples thereof include metallic materials which are reflective to visible light, for example, magnesium (Mg), magnesium alloy (Mg—In, Mg—Ag), etc. Coumarin 6 is mixed in a proportion (molar ratio) of about 3/100 relative to one VCz unit, and emits light due to excitons formed by the recombination of electrons and holes in the luminescent layer 14. TPD is mixed in a proportion (molar ratio) of about 10/100 with respect to one VCz unit, while BND is mixed in a proportion (molar ratio) of about 17/100 relative to one VCz unit.

Figure 10:
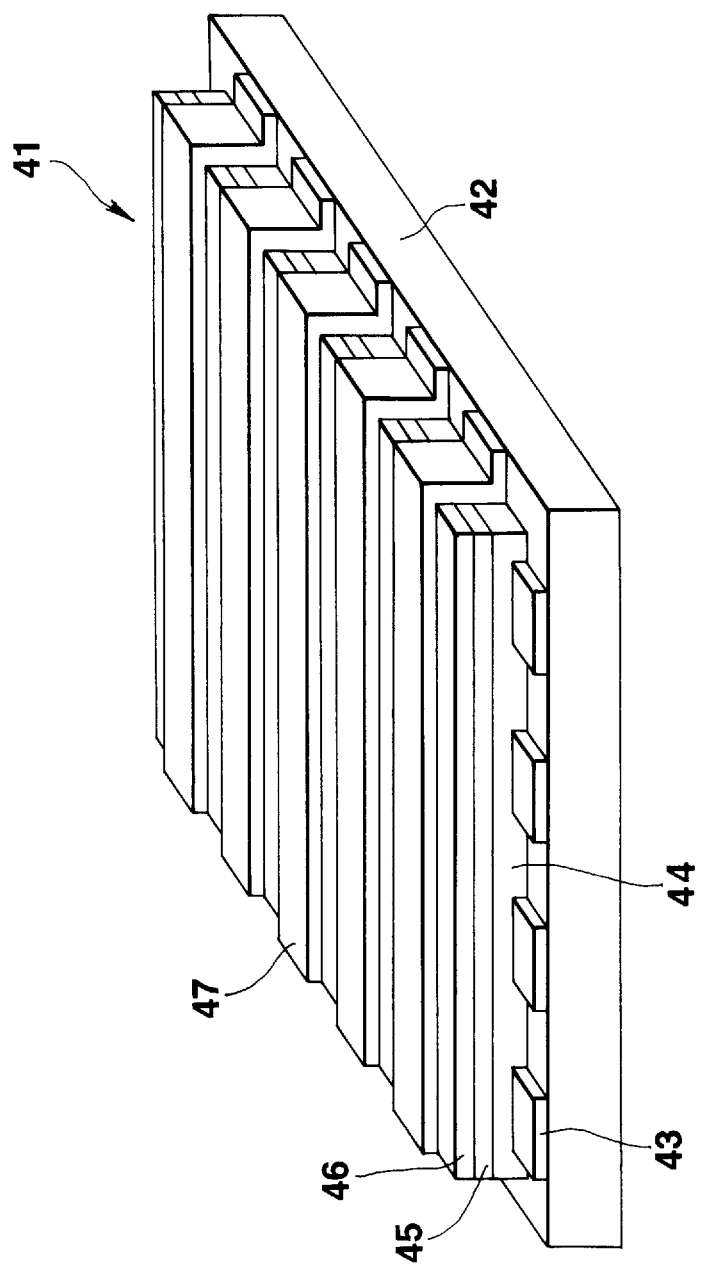
FIG. 10 is a perspective view illustrating a structure of a matrix type organic EL display device of the present invention.

FIG. 10 is a perspective view illustrating a structure of a matrix type organic EL display device 41 according to the third embodiment of the present invention. A plurality of anode electrodes 43 of ITO or IXO extending in the line direction are arranged on a transparent substrate 42, and a hole transport layer 44 of TPD is formed on the entire surface of the substrate 42. A luminescent layer 45 of PVCz, TPD, BND and coumarin 6, and an electron transport layer 46 of Alq3 are laminated in this order thereon. A plurality of cathode electrodes 47 of a magnesium alloy extend thereon in the row direction perpendicular to the line direction, and each intersection of the anode electrode 43 and cathode electrode 47 forms a pixel.

A selective signal voltage is sequentially applied to the anode electrode 42 et every each line. A signal voltage synchronizes with the selective signal voltage and is applied to the cathode electrode 47. Regarding the selected line, coumarin 6 emits visible light within a predetermined wavelength range due to excitons formed by the recombination of electrons and holes, and each pixel maintains light emission during one flame and display is effected on the whole image plane.

In the organic EL device of a matrix structure, the luminance of light emission can be controlled according to a voltage value applied between the electrodes 43, 47. It is also possible to conduct multi-color display by mixing two or more kinds of fluorescent materials emitting light within any desired wavelength range in the carrier transport layer corresponding to the respective pixels.

Figure 11:
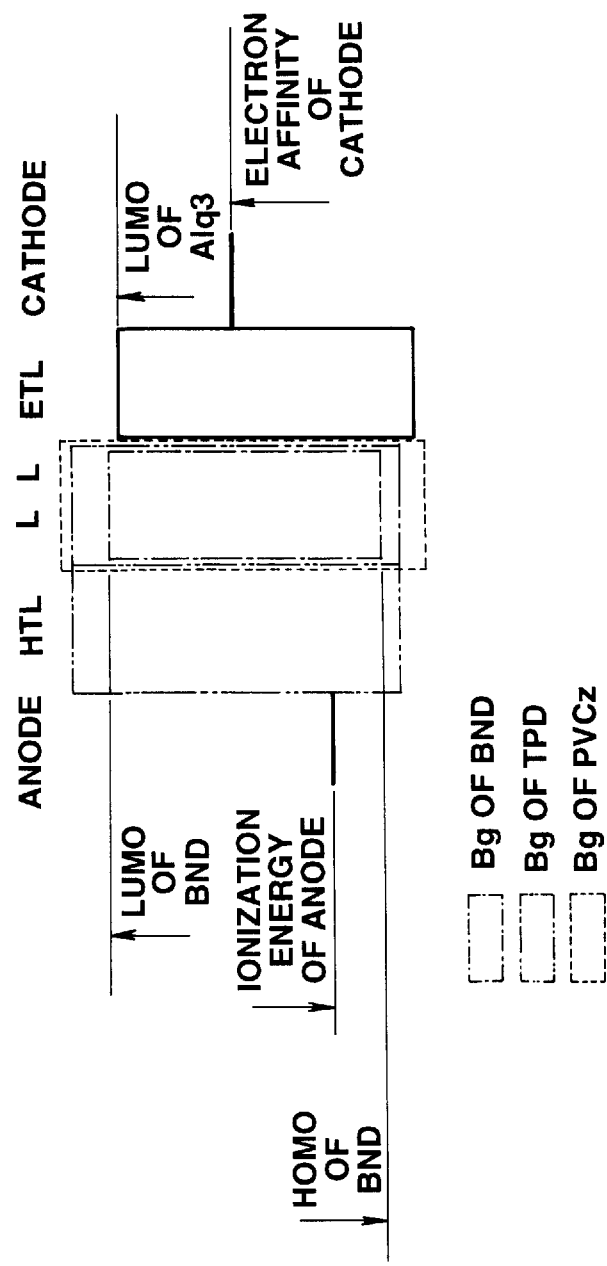
FIG. 11 is an energy diagram of the organic EL device according to the third embodiment of the present invention.

The organic EL device whose carrier transport layer has a three-layer structure affords an energy diagram as shown in FIG. 11. Since TPD as HTL has a small ionization potential in comparison with PVCz, holes are easily injected from the anode. HTL transports the injected holes to LL as the luminescent layer, and the transported holes are recombined with electrons transported from the ETL side in LL to emit light.

Figure 12:
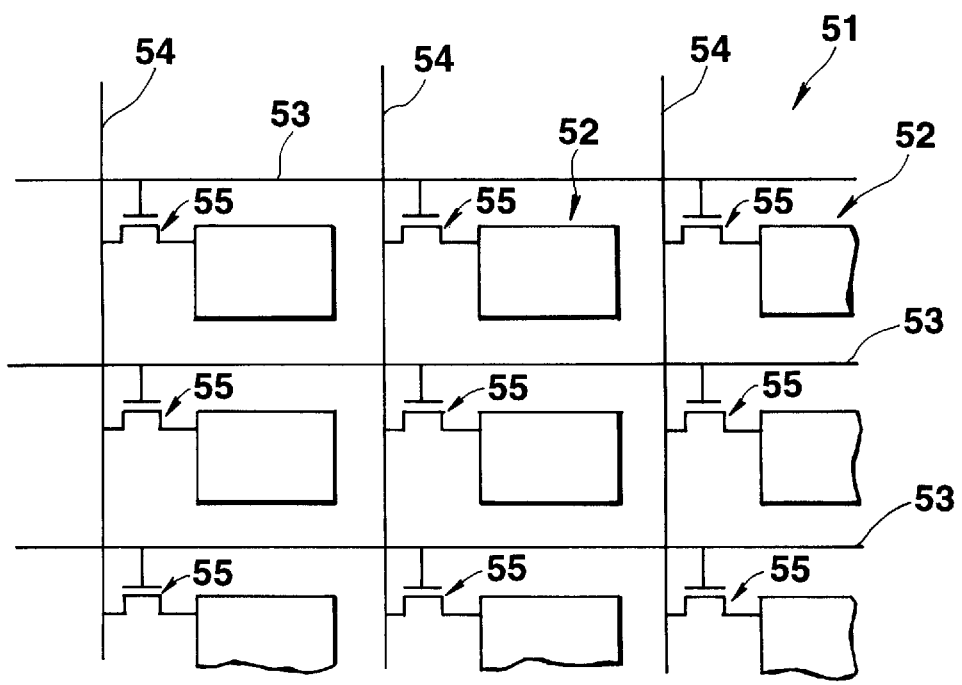
FIG. 12 is a circuit diagram of an active matrix driving display device to which an organic EL device of the present invention is applied.

FIG. 12 is a circuit diagram of an active matrix driving display device 51 to which the above organic EL device of the two-layer or three-layer structure of the present invention is applied.

The display device 51 comprises organic EL devices 52 arranged in a matrix. The respective anode electrodes of organic EL devices 52 are respectively connected to respective thin-film transistors 55. The respective thin-film transistors 55 are respectively connected to respective gate lines 53 arranged in the line direction and respective drain lines 54 arranged in the row direction.

The thin-film transistor 55 in the predetermined line is switched on by a selective signal from the gate line 53, and a predetermined luminescent signal from the drain line 54 is inputted in the organic EL device 52 through the thin-film transistor 55.

The organic EL devices emit light due to recombination of holes and electrons injected in accordance with a voltage applied between cathode electrodes and anode electrodes thereof.

Figure 13:
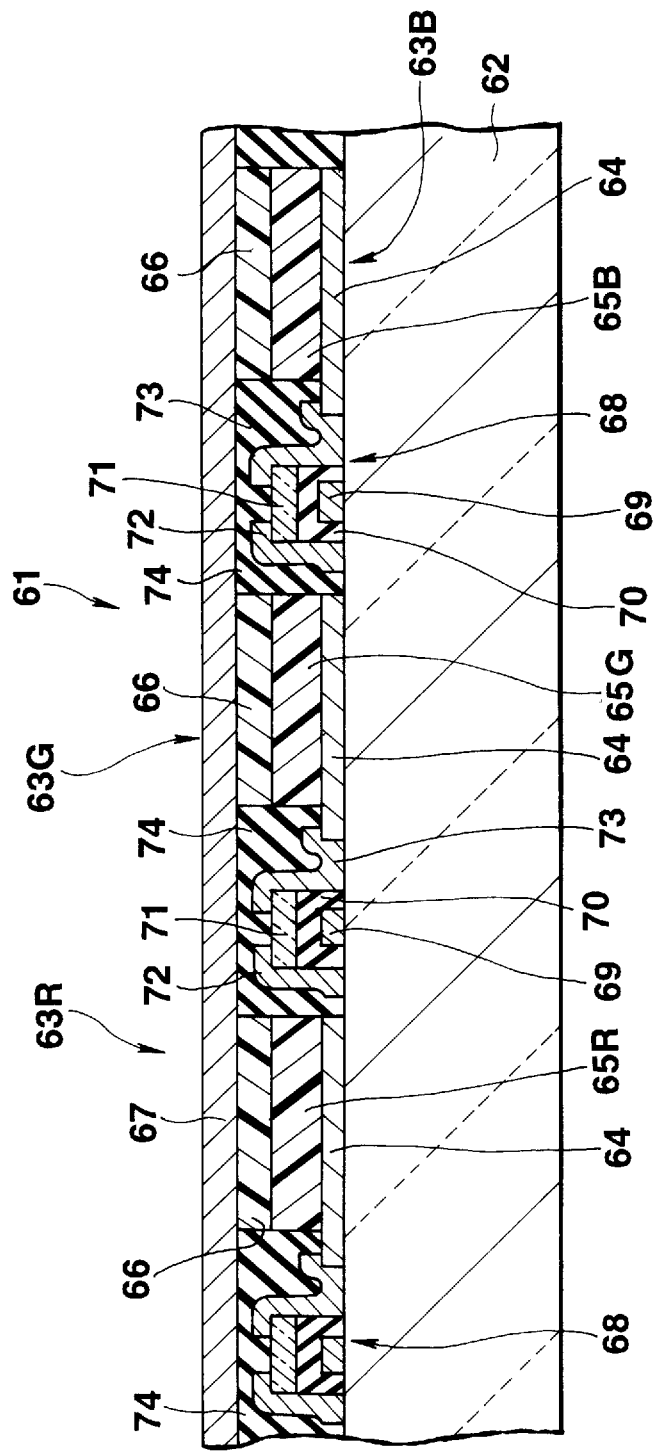
FIG. 13 is a sectional view illustrating an active matrix driving display device to which an organic EL device of the present invention is applied.

FIG. 13 is a sectional view illustrating a two-layer type active matrix driving display device 61, which comprises organic EL devices 63R, 63G, 63B provided on a transparent substrate 62 in a matrix form, and a thin-film transistors 68. The organic EL devices 63R, 63G, 63B are devices which respectively emit red light, green light and blue light, and luminescent layers 65R, 65G and 65B are respectively formed on anode electrodes 64. DCM1, coumarin 6 and 4,4'-bis(2,2'-diphenylvinylene)biphenyl are respectively added to the luminescent layers 65R, 65G, 65B, in addition to PVCz and BND. An electron transport layer 66 of Alq3 is formed on the luminescent layers 65R, 65G, 65B, and a common cathode electrode 67 of a Mg—Ag alloy is formed on the whole surface of the electron transport layer 66.

The thin-film transistor 68 has a structure that a drain electrode 72 and a source electrode 73 are formed at a distance from each other at both end portions of a semiconductor 71 of amorphous silicon provided on a gate insulating film 70 which covers a gate electrode 69 connected to a gate line, and the source electrode 73 is connected to the anode electrode 64. The thin-film transistor 68 is insulated from others with an opaque passivation film 74 having a black pigment, and the upper surface of the passivation film 74 is formed at substantially the same height as, or flush with, the electron transport layer 66. The cathode electrode 67 is smoothly formed thereon. In order to prevent deterioration of the cathode electrode 67, a sealing film for sealing the electrode against oxygen and water may be provided on the cathode electrode 67.

Since the cathode electrode 67 of a reflective metal is formed on the whole surface of the spontaneous luminescent device 61, light does not leak from the organic EL devices 63R, 63G, 63B to the cathode electrode 67 side, and display light is reflected to the substrate 62 side and, therefore, a display having high luminance can be realized.

The above display device has a two-layer structure, but may have a three-layer structure as in the third embodiment. The degree of color mixing can be improved by applying delta arrangement to the organic EL devices 63R, 63G, 63B. It is also possible to realize a more strong color tone by providing a color filter, which separates light into red, green and blue colors, to the organic EL devices 63R, 63G, 63B. Monochromatic color emission may be obtained by using one kind of a material as the fluorescent material.

The semiconductor 71 is composed of amorphous silicon. Instead, if a polysilicon is used, a thin-film transistor which are comparatively higher in height than the organic EL devices 63R, 63G, 63B can be miniaturized and thinned down to improve a relative luminescent area and, at the same time, the cathode electrode 67 is easily set at a flat film.

Fourth embodiment

It is an object of this embodiment to prevent deterioration of a cathode electrode which is liable to be oxidized and to improve injection properties of electrons into an electron transport layer.

Figure 14:
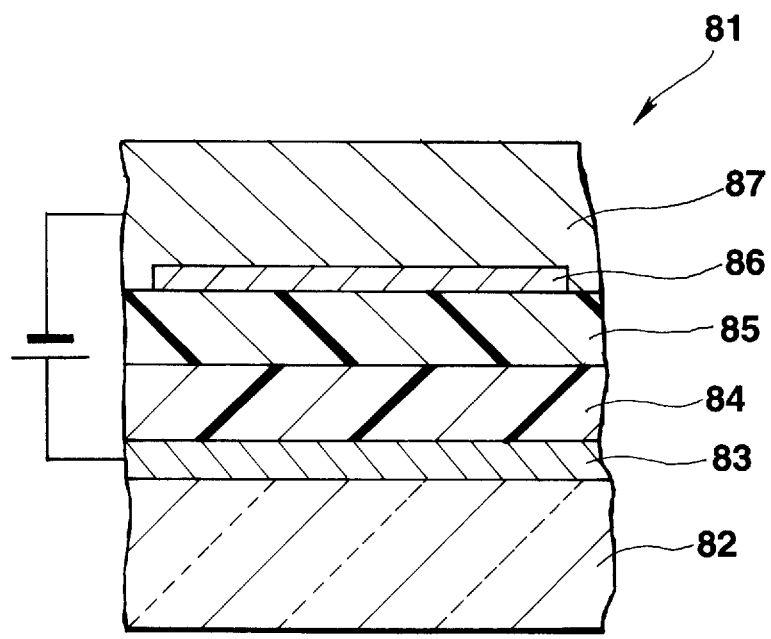
FIG. 14 is a sectional view illustrating a structure of an organic EL device according to a fourth embodiment of the present invention.

FIG. 14 is a sectional view illustrating a structure of an organic EL device according to the fourth embodiment of the present invention.

This organic EL device 81 has a structure that an anode electrode 83, a hole transport layer 84, an electron transport layer 85, a conductive layer 86 and a cathode electrode 87 are laminated in this order on a transparent substrate 82 of glass or a resin.

The anode electrode 83 is a film of ITO or IXO, which has a thickness of 50 to 150 nm, a transmittance of not less than 70% to visible light and a sheet resistance of not more than 50Ω. The hole transport layer 84 is a thin film having a thickness of about 50 nm, formed by mixing PVCz with TPD [N,N'-diphenyl-N,N'-bis(3-methylphenyl)-1,1'-biphenyl-4,4'-diamine] in a molar ratio of 1:1. The hole transport layer 84 is formed by co-depopsition of PVCz and TPD, or dissolving PVCz and TPD in a solvent, followed by spin coating. The electron transport layer 85 is a film of Alq3 having a thickness of about 50 nm, formed by vacuum deposition and has electron transporting properties and a function as a luminescent layer. The conductive layer 86 is a layer having a thickness of 3 nm, obtained by co-deposition of magnesium (Mg) and Alq3, and can be continuously formed by deposition after the deposition with Alq3 of the electron transport layer 85. A deposition rate ratio (Mg:Alq3) in the co-deposition of the conductive layer 86 is 20:1 and a molar ratio thereof is 656:1. Magnesium has a work function value of 3.61 to 3.66 eV. The cathode electrode 87 covering the thin conductive layer 86 is made of silver (Ag) having a thickness of about 300 nm. Silver has a work function value of 4.2 to 4.8 eV.

Regarding the organic EL device 81, when setting a D.C. voltage value applied between the anode electrode 83 and cathode electrode 87, carriers are recombined in the transport layer where the conductive layer 86 and anode electrode 83 intersect, thereby emitting light. That is, the cathode electrode 87 has a high work function and is inferior in electron injection properties to the conductive layer 86. Therefore, even if there is a portion of the anode electrode 83 in contact with the luminescent layer, when a voltage value is set so that electrons injected into the electron transport layer 85 is injected only from the conductive layer 86, and when the conductive layer 86 is patterned in the shape of a character letter, the character letter can emits light without patterning the cathode electrode 87 into the shape of the character letter. By applying such a shape, the transport layer, which corresponds to a wiring formed on the electron transport layer and flush with that of the conductive layer 86 using the same material as that of the conductive layer 86, does not emit light. In addition, in order to make the wiring emit no light, an insulating film having a contact hole for connecting with the wiring may not be formed between the conductive layer and cathode electrode.

Since the organic EL device 81 has a structure that a conductive layer 86 containing magnesium having a low work function, that is, which is liable to be oxidized is sealed with a film of silver having a relatively high work function, that is, which is not readily oxidized, deterioration of the conductive layer 86 is inhibited and substantially the same electron injection properties as those of magnesium can be realized. Furthermore, the same material as that of the electron transport layer 85 is added in the conductive layer 86 and, therefore, the joining properties between the conductive layer 86 and electron transport layer 85 can be improved and peeling with time can be inhibited.

Figure 15:
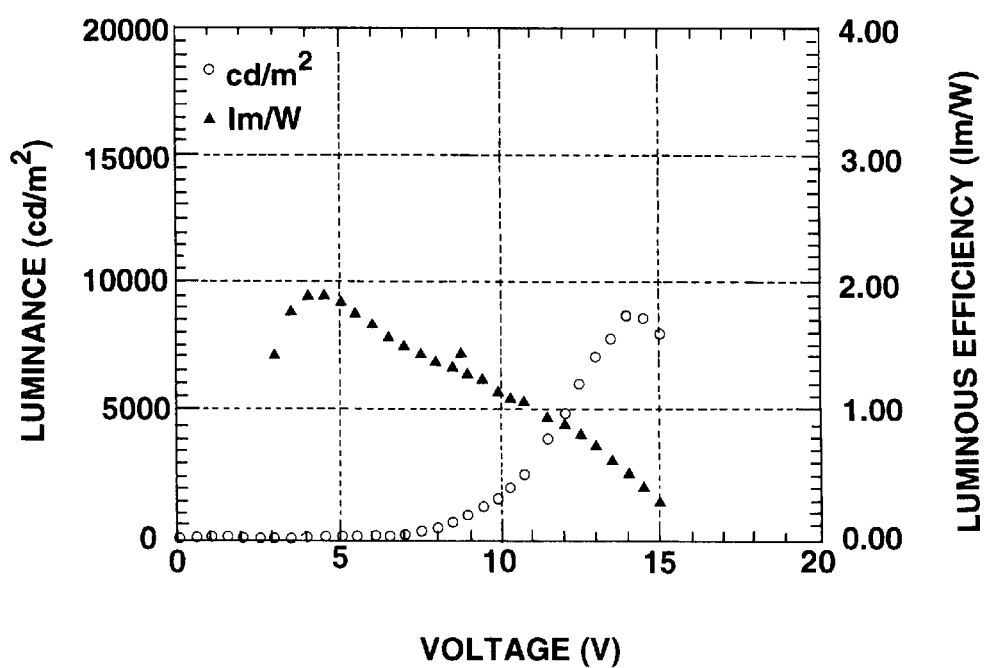
FIG. 15 is a graph illustrating luminance and efficiency characteristics for voltage of the organic EL device according to the fourth embodiment of the present invention.

FIG. 15 is a graph illustrating voltage-luminous characteristics obtained when applying a D.C. voltage between the anode electrode 83 and cathode electrode 87 of the organic EL device 81.

The organic EL device 81 emits light having a brightness of about 8000 cd/m$^2$ at about 14V and an efficiency (lm/W) thereof is about 2.00 at maximum. An efficiency of about 0.5 lm/W can be obtained even at 14V. The efficiency can be calculated from the following equation:

Efficiency (lm/W)=luminance (cd/m$^2$)/{current density (A/m$^2$)*voltage (V)}

Figure 16:
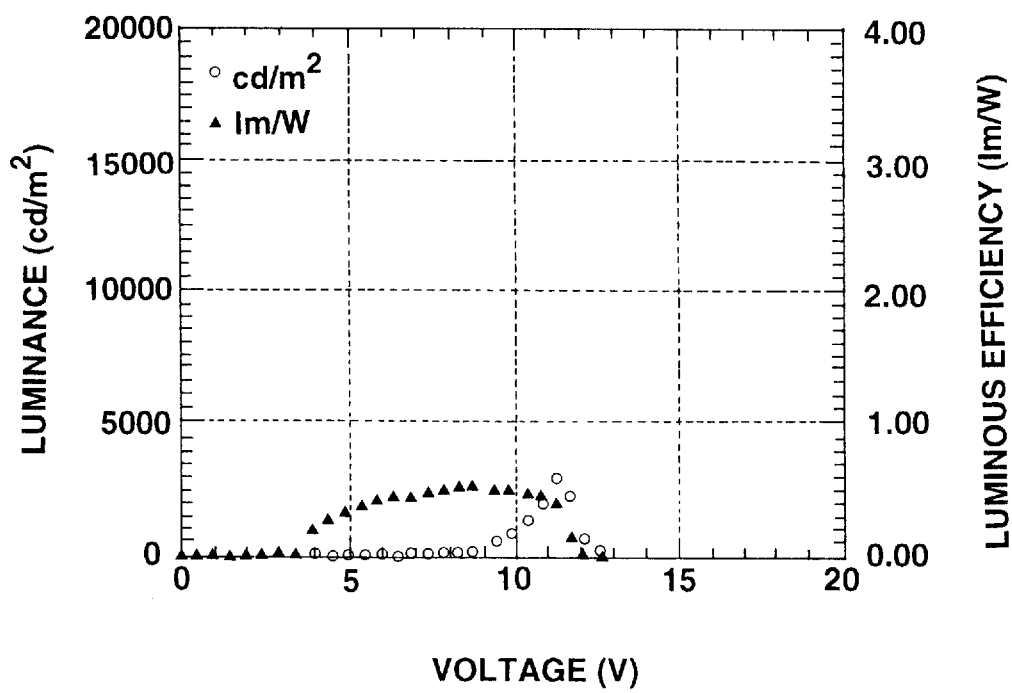
FIG. 16 is a graph illustrating luminance and efficiency characteristics for voltage of an organic EL device according to a first Comparative Example.
Figure 17:
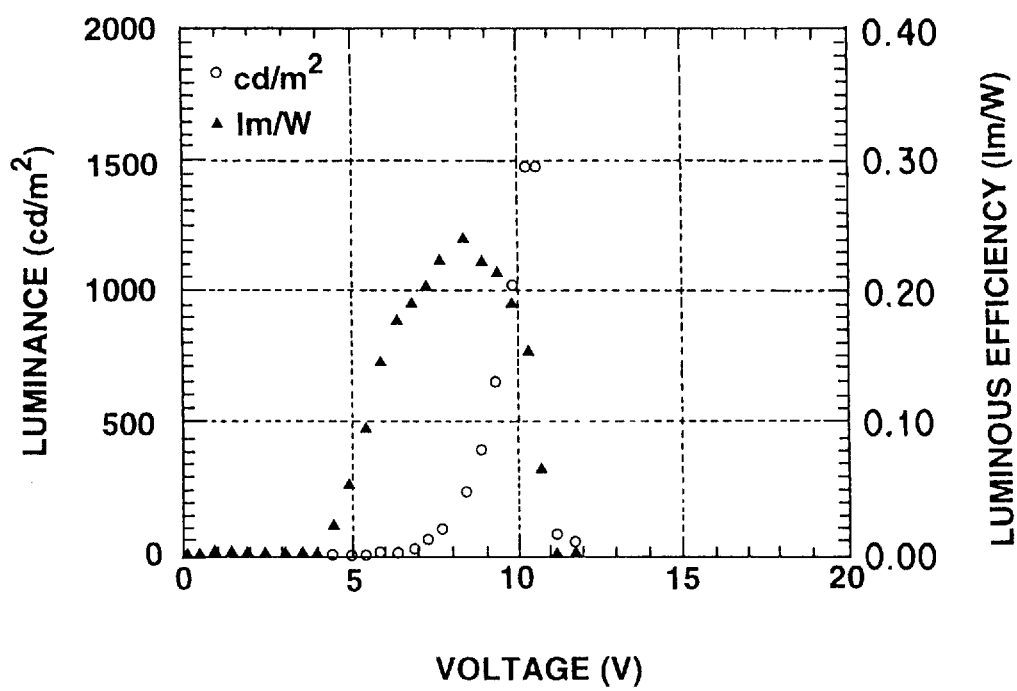
FIG. 17 is a graph illustrating luminance and efficiency characteristics for voltage of an organic EL device according to a second Comparative Example.

FIG. 16 is a graph illustrating voltage-luminous characteristics of the device having a structure that the conductive layer 86 is removed from the organic EL device 81 as the Comparative Example. The brightness is about 3000 cd/m$^2$ at most and the efficiency is only about 0.6 lm/W at most. FIG. 17 is a graph illustrating voltage-luminance characteristics of the organic EL device 81 using a layer of Alq3 and silver in place of the conductive layer 86 (Alq3 and magnesium) as the Comparative Example. The brightness is about 1450 cd/m$^2$ at most and the efficiency is only about 0.24 lm/W at most.

Figure 18:
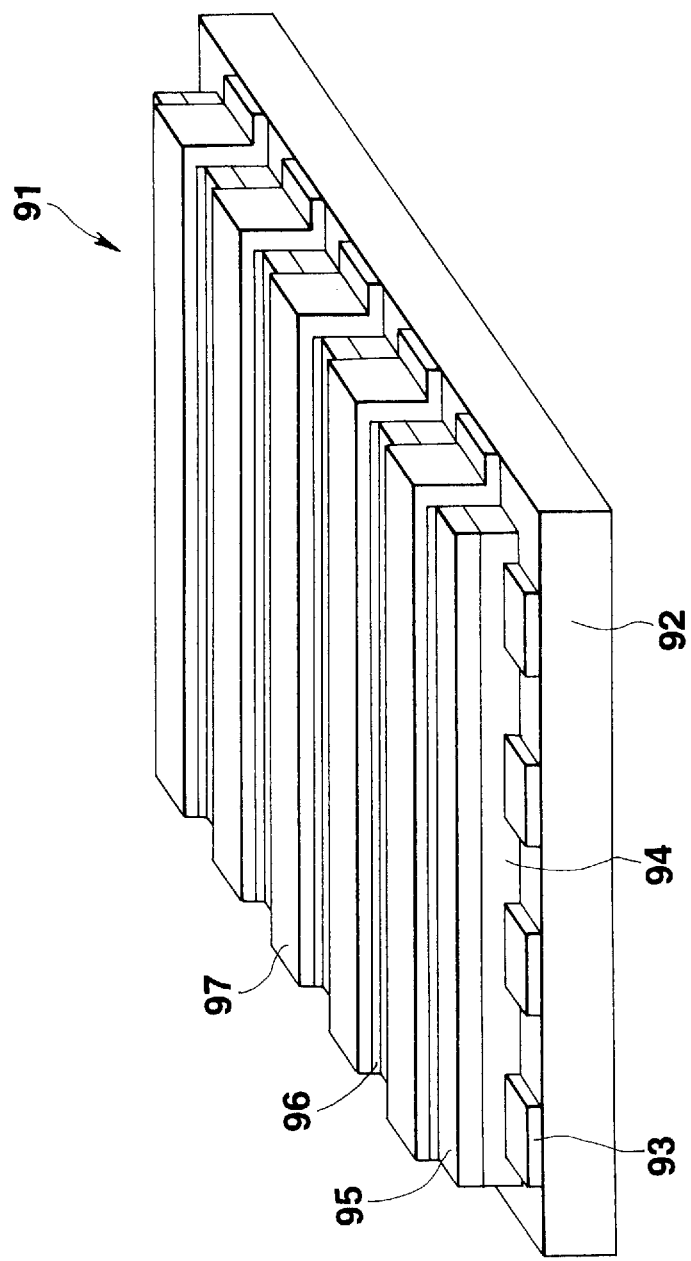
FIG. 18 is a perspective view illustrating a structure of a matrix type organic EL display device according to the fourth embodiment of the present invention.

FIG. 18 shows an organic EL device 91, in which a plurality of anode electrodes 93 of ITO or IXO extending in the line direction are arranged on a transparent substrate 92, and a luminescent layer 94 of PVCz, TPD and coumarin 6 and an electron transport layer 95 of Alq3 are laminated in this order on the entire surface of the substrate 92. A conductive layer 96 formed by co-deposition of magnesium and Alq3 extends on the electron transport layer 95 in the row direction perpendicular to the line direction and a cathode electrode 97 of silver extends in the row direction, similar to the conductive layer 96, so as to cover the conductive layer 96, and an intersection of the anode electrode 93 and cathode electrode 96 respectively become a pixel.

A selective signal voltage is sequentially applied to the anode electrode 93 at every each line. A luminous signal voltage corresponding to display data synchronizes with the selective signal voltage and is simultaneously applied to the cathode electrode 97. Regarding the selected line, coumarin 6 emits visible light within a predetermined wavelength range due to excitons formed by the recombination of electrons and holes, and each pixel maintains light emission during one flame and display is effected on the whole image plane.

In the organic EL device having such a structure, gradation of light emission can be controlled by a voltage value applied between the electrodes 93, 96. It is also possible to conduct multi-color display by mixing two or more kinds of fluorescent materials emitting light within any desired wavelength range in the carrier transport layer corresponding to the respective pixels. Regarding the conductive layer 96, the side part is exposed but the thickness is only about 3 nm and, therefore, the conductive layer is not largely oxidized in the transverse direction. The multi-color light emission may be conducted by providing fluorescent materials which respectively emit red, green and blue lights. The above luminescent layer 94 is composed of PVCz, TPD and the fluorescent material, but may be a layer of PVCz, BND and the fluorescent material or a layer of PVCZ, BND, TPD and the fluorescent material. In the electron transport layer and conductive layer, the same material of Alq3 is used. However, a first electron transporting material having a predetermined level of LUMO may be used as the organic material of the conductive layer, and a second electron transporting material having carrier transporting properties higher than those of the first electron transporting material and a level of LUMO higher than that of the first electron transporting material may be used as the organic material of the electron transport layer.

Figure 19:
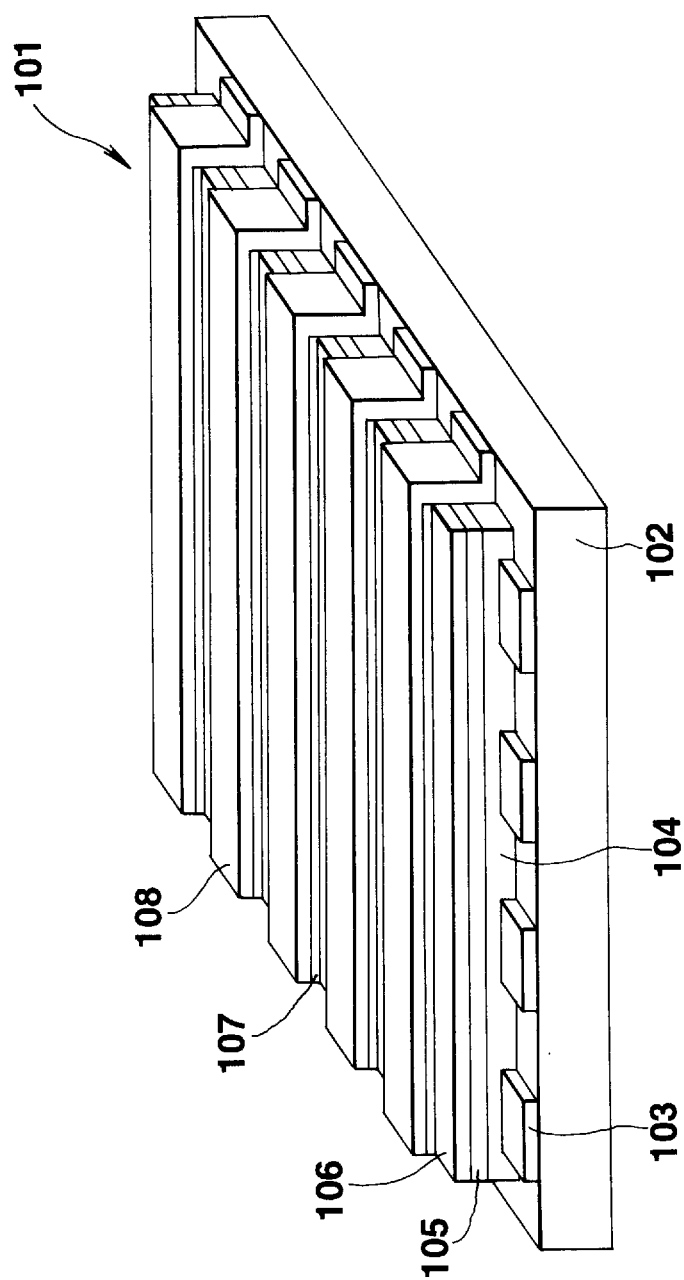
FIG. 19 is a perspective view illustrating a structure of a matrix type organic EL display device having a three-layer structure according to the fourth embodiment of the present invention.

As shown in FIG. 19, the EL device may also be an organic EL device 101 having a three-layer structure. The organic EL device 101 comprises a plurality of anode electrodes 103 of ITO or IXO extending in the line direction, which are arranged on a transparent substrate 102. A hole transport layer 104 of TPD, a luminescent layer 105 of PVCz, TPD and coumarin 6 and an electron transport layer 106 of Alq3 are laminated in this order on the entire surface of the substrate 102. A conductive layer 107 formed by co-deposition of magnesium and Alq3 extends thereon in the row direction perpendicular to the line direction, and a cathode electrode 108 of silver extends on the 10 conductive layer 107 in the row direction, similar to the conductive layer. An intersection of the anode electrode 103 and cathode electrode 107 respectively becomes a pixel.

Figure 20:
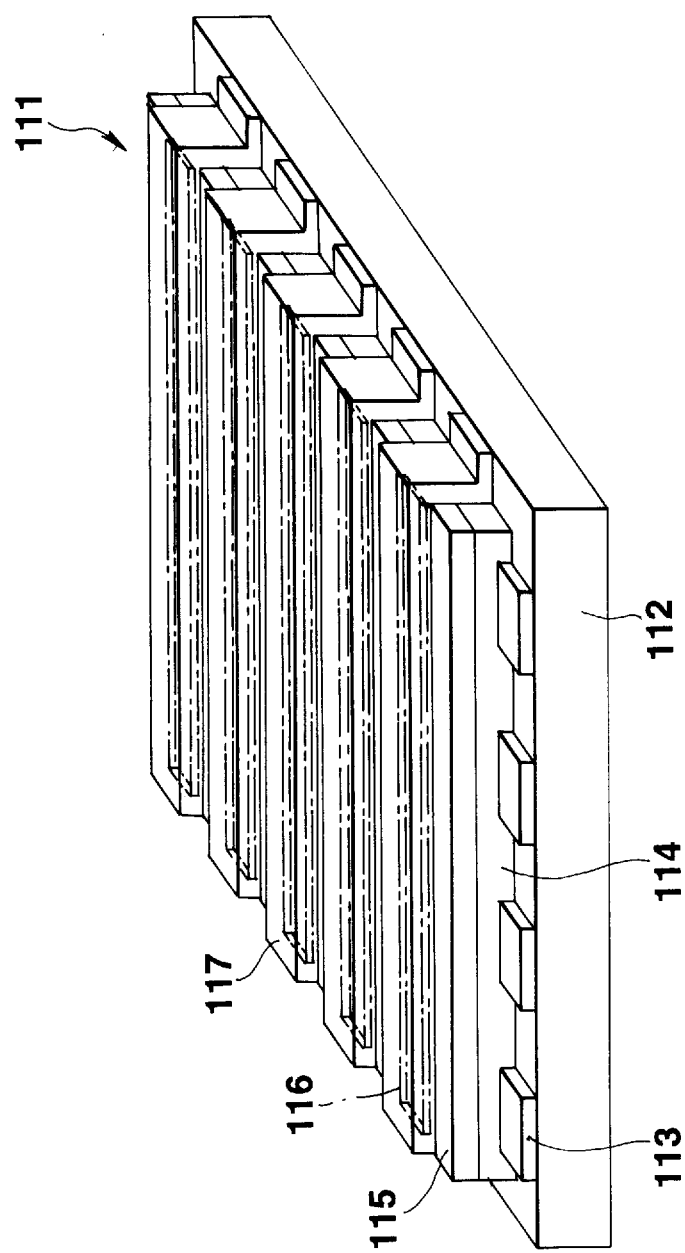
FIG. 20 is a perspective view illustrating a structure of a matrix type organic EL display device whose conductive layer is completely covered with a cathode electrode.

FIG. 20 shows a structure that the total surface 15, of the conductive layer containing a material which is liable to be oxidized is covered with a cathode electrode which is not readily oxidized.

The organic EL device 111 shown in FIG. 20 has a plurality of anode electrodes 113 of ITO or IXO extending in the line direction, which are arranged on a transparent substrate 112. A luminescent layer 114 of PVCZ, BND and coumarin 6 and an electron transport layer 115 of Alq3 are laminated in this order on the entire surface of the substrate 112. A conductive layer 11 formed by co-deposition of magnesium and Alq3 extends thereon in the row direction and a cathode electrode 117 of silver extends in the row direction, similar to the conductive layer, so as to cover the conductive layer 116. An intersection of the anode electrode 113 and cathode electrode 116 respectively becomes a pixel.

In the fourth embodiment, the electron injection properties and joining properties with the electron transport layer can be improved by adding the same material as that of the electron transport layer to a metallic material having a low work function value. Since the conductive layer is covered with a metallic material which is not readily oxidized, deterioration of the conductive layer due to oxidation can be prevented. In the fourth embodiment, the carrier transport layer comprises a plurality of layers, but it may be a single layer wherein the Alq3 layer is excluded.

In the fourth embodiment, magnesium is used as a metallic material which is the component of the conductive layer. The metallic material which is liable to be oxidized may also be hafnium (Hf, work function: 3.63 eV) or rare earth elements such as scandium (Sc, work function: 3.5 eV), yttrium (Y, work function: 3.1 eV), lanthanum (La, work function: 3.5 eV), cerium (Ce, work function: 2.9 eV), praseodymium (Pr), neodymium (Nd, work function: 3.2 eV), promethium (Pm), samarium (Sm, work function: 2.7 eV), europium (Eu, work function: 2.5 eV), gadolinium (Gd, work function: 3.1 eV), terbium (Tb, work function), dysprosium (Dy), holmium (Ho), erbium (Er, work function: 2.97 eV), thulium (Tm), ytterbium (Yb, work function: 2.6 eV) and lutetium (Lu), or alloys containing these elements. The cathode electrode material having a high work function should not be limited to silver, but may be a metallic material of which oxidation proceeds slowly in air or which forms an oxide film causing no deterioration on the surface, for example, aluminum (Al, work function: 4.18 eV), chromium (Cr, work function: 4.4 eV), iron (Fe, work function: 4.46 eV), cobalt (Co, work function: 4.97 eV), nickel (Ni, work function: 5.15 eV), copper (Cu, work function: 4.59 eV), molybdenum (Mo, work function: 4.21 eV), tin (Sn, work function: 4.43 eV), antimony (Sb, work function: 4.56 eV), tantalum (Ta, work function: 4.20 eV), tungsten (W, work function: 4.55 eV), platinum (Pt, work function: 5.43 eV) or gold (Au, work function: 5.20 eV), or alloys containing these elements.

In the first to fourth embodiments described above, PVCz for dispersing a fluorescent material and the fluorescent material are mixed so as to inhibit concentration quenching caused by agglomeration of the fluorescent material due to a hydrogen bond. However, a fluorescent material which absorbs light within a luminescent wavelength range of Alq3 or a hole transport layer and emit light within a predetermined wavelength range may be added in Alq3 or in Alq3 and the hole transport layer. Alq3 itself emits blue-green light by the recombination of holes and electrons. A blue-green light having higher luminance can be emitted by mixing coumarin in Alq3.

What is claimed is:

1. A carrier-injection type organic electroluminescent device which emits light in response to an applied voltage, comprising:

a cathode electrode;

an anode electrode provided at a distance from said cathode electrode;

an electron transport layer containing a tris(8-quinolinolate)aluminum complex which transports electrons in response to the applied voltage, said electron transport layer being provided adjacent to said cathode electrode; and a hole transport layer provided between said electron transport layer and said anode electrode, said hole transport layer containing a poly(N-vinylcarbazole) which substantially transports holes in response to the applied voltage, and a 2,5-bis(1-naphthyl-oxadiazole) having a highest occupied molecular orbital (HOMO) which is different from a HOMO of said poly(N-vinylcarbazole), and said hole transport layer emitting light within a visible light wavelength range by excitons formed by recombinations of the electrons and the holes.

2. The device according to claim 1, further comprising a fluorescent material which absorbs the light emitted by said hole transport layer and emits light having a longer wavelength than that of the light emitted by said hole transport layer, said fluorescent material being added in said hole transport layer.

3. The device according to claim 1, further comprising a third hole transporting material having a HOMO whose potential level is between a potential level of the HOMO of said poly(N-vinylcarbazole) and a potential level of the HOMO of said 2,5-bis(1-naphthyl)-oxadiazole, said third hole transporting material being fixed in said hole transport layer.

4. The device according to claim 3, wherein said third hole transporting material is N,N'-diphenyl-N,N'-bis(3-methylphenyl)-1,1'-biphenyl-4,4'-diamine.

5. A carrier-injection type organic electroluminescent device which emits light in response to an applied voltage, comprising:

a cathode electrode;

an anode electrode provided at a distance from said cathode electrode;

an electron transport layer comprising a tris(8-quinolinolate)aluminum complex, said electron transport layer being provided adjacent to the cathode electrode;

a hole transport layer comprising poly(N-vinylcarbazole) and 2,5-bis(1-naphthyl)-oxadiazole, said hole transport layer being provided between said electron transport layer and said anode electrode, and said hole transport layer emitting light within a predetermined wavelength range; and a fluorescent material which absorbs the light emitted by said hole transport layer and emits light having a longer wavelength than that of the light emitted by said hole transport layer, said fluorescent material being added in said hole transport layer.

6. A carrier-injection type organic electroluminescent device which emits light in response to an applied voltage, comprising:

a cathode electrode containing a first conductive metal which exhibits electroconductivity;

an anode electrode provided at a distance from said cathode electrode;

a conductive layer provided adjacent to the cathode electrode, said conductive layer containing a first organic electron transporting material which transports electrons in response to the applied voltage and a second conductive metal having a work function lower than that of said first conductive metal of said cathode electrode; and an electron transport layer comprising a second organic electron transporting material which transports electrons in response to the applied voltage, said electron transport layer being provided adjacent to said conductive layer.

7. The device according to claim 6, wherein said second conductive metal is selected from the group consisting of magnesium (Mg), scandium (Sc), yttrium (Y), lanthanum (La), cerium (Ce), praseodymium (Pr), neodynium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), hafnium (Hf) and an alloy thereof.

8. The device according to claim 6, wherein said first conductive metal is selected from the group consisting of aluminum (Al), chromium (Cr), iron (Fe), cobalt (Co), nickel (Ni), copper (Cu), molybdenum (Mo), tin (Sn), antimony (Sb), tantalum (Ta), tungsten (W), platinum (Pt), gold (Au), and an alloy thereof.

9. The device according to claim 6, wherein said first organic electron transporting material and said second organic electron transporting material are identical materials.

10. The device according to claim 6, wherein said first organic electron transporting material is tris(8-quinolinolate) aluminum complex.

11. The device according to claim 6, wherein said first organic electron transporting material is different from said second organic transporting material.

12. The device according to claim 6, wherein said electron transport layer comprises a luminescent layer which emits light within a predetermined wavelength range.

13. The device according to claim 12, further comprising a fluorescent material which absorbs the light emitted by said electron transport layer and emits light having a longer wavelength than that of the light emitted by said electron transport layer, said fluorescent material being added in said electron transport layer.

14. The device according to claim 6, further comprising an organic hole transport layer including an organic hole transporting material which transports holes in response to the applied voltage, said hole transport layer being provided between said electron transport layer and said anode electrode.

15. The device according to claim 14, wherein said organic hole transport layer comprises a luminescent layer which emits visible light.

16. The device according to claim 14, wherein said organic hole transport layer comprises a mixture of poly(N-vinylcarbazole) and a triphenyldiamine derivative.

17. The device according to claim 14, wherein said organic hole transport layer comprises a mixture of poly(N-vinylcarbazole), a triphenyldiamine derivative and 2,5-bis(1-naphthyl)-oxadiazole.

18. The device according to claim 14, wherein said organic hole transport layer comprises a mixture of poly(N-vinylcarbazole) and 2,5-bis(1-naphthyl)-oxadiazole.

19. The device according to claim 15, further comprising a fluorescent material which absorbs the light emitted by said organic hole transport layer and emits light having a longer wavelength than that of the light emitted by said organic hole transport layer, said fluorescent material being added in said organic hole transport layer.

* * * * *